(12) United States Patent
Siewert et al.

(10) Patent No.: US 12,158,312 B2
(45) Date of Patent: Dec. 3, 2024

(54) METHOD FOR THE PRODUCTION OF A HEAT SINK COMPOSED OF METAL

(71) Applicant: Erwin Quarder Systemtechnik GmbH, Espelkamp (DE)

(72) Inventors: Georg Siewert, Pohlheim (DE); Alexander Heitbrink, Stemwede (DE)

(73) Assignee: Erwin Quarder Systemtechnik GmbH, Espelkamp (DE)

( * ) Notice: Subject to any disclaimer, the term of this patent is extended or adjusted under 35 U.S.C. 154(b) by 0 days.

(21) Appl. No.: 18/501,445

(22) Filed: Nov. 3, 2023

(65) Prior Publication Data

US 2024/0068757 A1 Feb. 29, 2024

Related U.S. Application Data

(62) Division of application No. 17/741,760, filed on May 11, 2022, now Pat. No. 11,879,695.

(30) Foreign Application Priority Data

May 12, 2021 (DE) .......................... 102021112412.3

(51) Int. Cl.
*F28F 3/02* (2006.01)
*B23P 15/26* (2006.01)
(Continued)

(52) U.S. Cl.
CPC .............. *F28F 3/025* (2013.01); *B23P 15/26* (2013.01); *F28D 21/00* (2013.01); *F28F 21/084* (2013.01); *F28D 2021/0029* (2013.01)

(58) Field of Classification Search
CPC .......... F28F 3/025; F28F 21/084; F28F 3/048; F28F 3/12; B23P 15/26; B23P 2700/10;
(Continued)

(56) References Cited

U.S. PATENT DOCUMENTS 1,063,659 A * 6/1913 Conklin .................... B23C 5/08
411/372
1,364,925 A 1/1921 Fischer
(Continued)

FOREIGN PATENT DOCUMENTS

AT 377644 B 4/1985
DE 1285275 A 12/1968
(Continued)

OTHER PUBLICATIONS

Deutsches Patent-Und Markenamt (German Patent and Trademark Office), Recherchbericht, (search in a related application), Dec. 17, 2021.

*Primary Examiner* — Lee A Holly
(74) *Attorney, Agent, or Firm* — Laurence P. Colton; Smith Tempel Blaha LLC

(57) ABSTRACT

A method for the production of a heat sink composed of metal, preferably composed of a solid metal block, in particular composed of aluminium. The heat sink has a plurality of fluid lines for conducting cooling fluid which are separated from one another by heat sink ribs arranged between them, which are arranged next to one another and which run in a parallel manner. It is characterized in that the fluid lines are formed by grooves which are milled into the metal.

22 Claims, 3 Drawing Sheets

(51) Int. Cl.
*F28D 21/00* (2006.01)
*F28F 21/08* (2006.01)

(58) Field of Classification Search
CPC ............. F28D 21/00; F28D 2021/0029; B23C 2210/244; B23C 3/305; B23C 3/34; B23C 5/08; H01L 21/4878; H01L 23/473
See application file for complete search history.

(56) References Cited

U.S. PATENT DOCUMENTS

| | | | |
|---|---|---|---|
| 3,260,158 A | | 7/1966 | Chiffolot |
| 5,519,938 A | * | 5/1996 | Kojima ............... H01L 23/3677 |
| | | | 257/E23.105 |
| 2010/0239424 A1 | * | 9/2010 | Maalouf ............... F01D 5/3069 |
| | | | 416/219 R |
| 2012/0301233 A1 | | 11/2012 | Gesell |
| 2013/0022414 A1 | | 1/2013 | Athad |
| 2019/0210119 A1 | * | 7/2019 | Teusch ..................... B23C 3/34 |

FOREIGN PATENT DOCUMENTS

| | | |
|---|---|---|
| DE | 102010054392 A1 | 6/2012 |
| DE | 102016216464 A1 | 3/2018 |
| DE | 102016122612 A1 | 5/2018 |
| EP | 0560259 A1 * | 3/1993 |
| EP | 1138842 B1 | 7/2003 |
| JP | 2009056520 A | 3/2009 |
| JP | 2017042861 A | 3/2017 |

\* cited by examiner

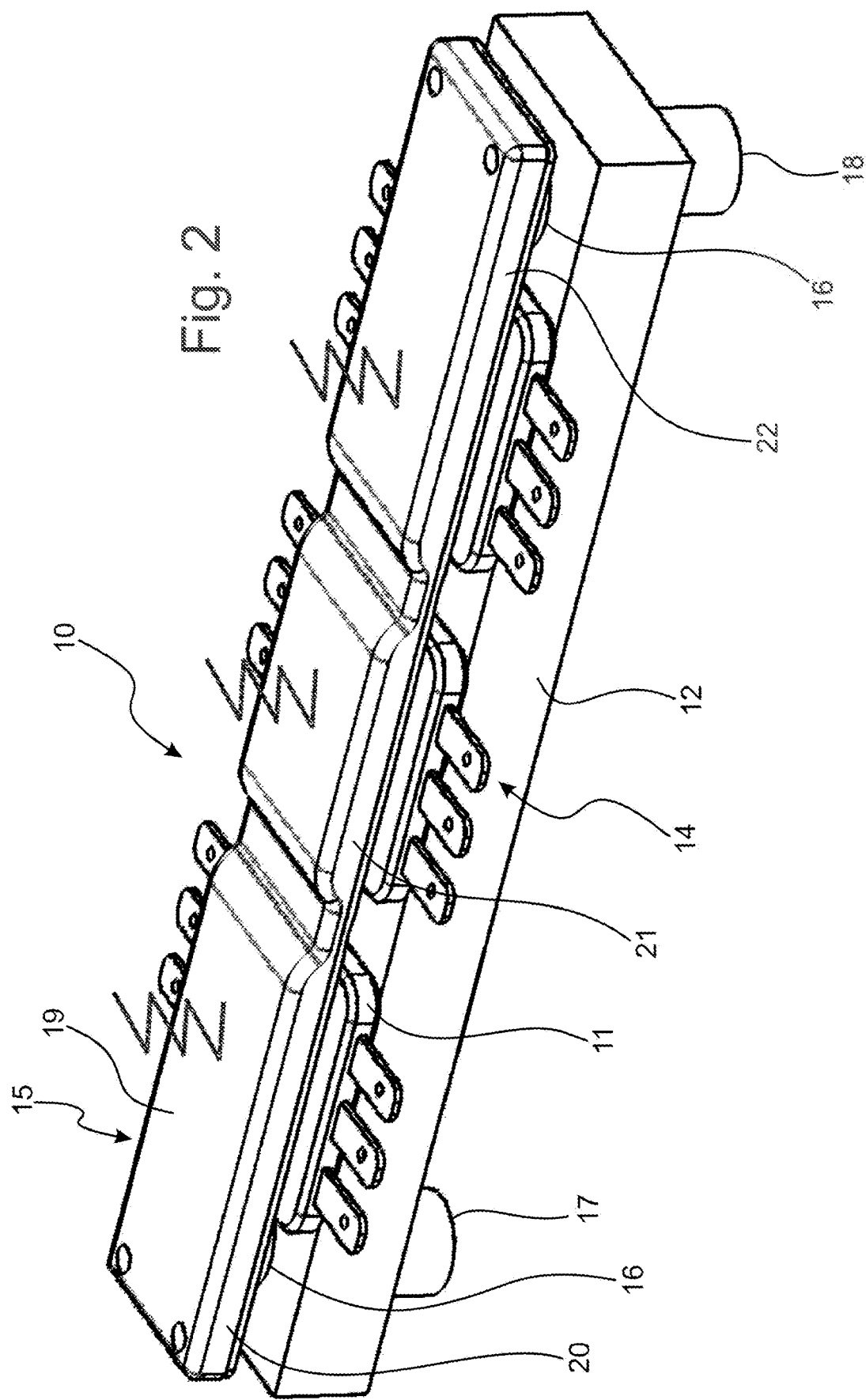

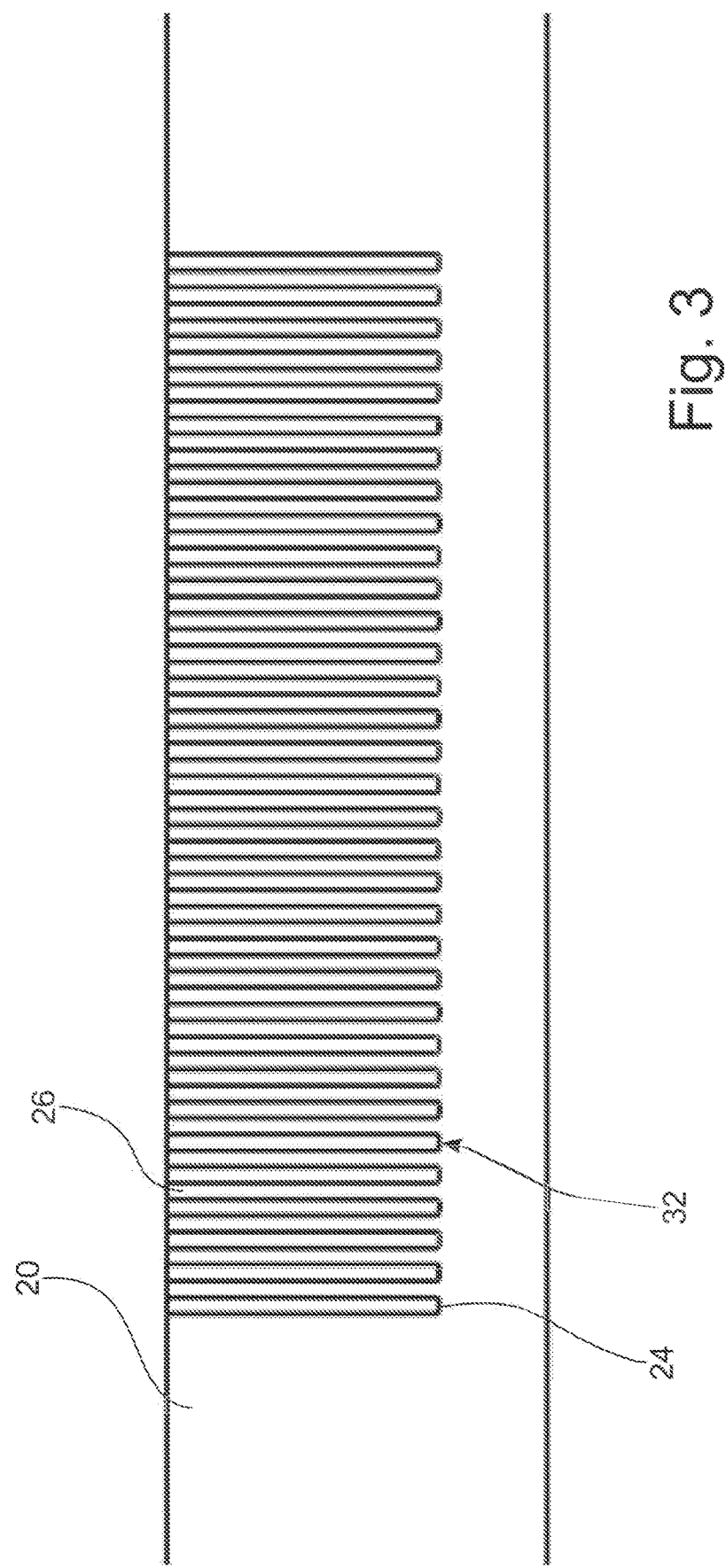

METHOD FOR THE PRODUCTION OF A HEAT SINK COMPOSED OF METAL

CROSS REFERENCE TO RELATED APPLICATIONS

This patent application is a divisional of and claims priority on and the benefit of U.S. patent application Ser. No. 17/741,760 having a filing date of 11 May 2022, which claims priority on and the benefit of German Patent Application No. 10 2021 112 412.3 having a filing date of 12 May 2021.

BACKGROUND OF THE INVENTION

Technical Field

The present invention relates to a heat sink composed of metal, in particular composed of aluminium, having a plurality of fluid lines for conducting cooling fluid which are separated from one another by heat sink ribs arranged between them, which are arranged next to one another and which run in a parallel manner, and also to a method and a tool for introducing grooves into a workpiece composed of metal, in particular during the course of the production of such a heat sink.

Prior Art

Such heat sinks composed of metal are produced in various ways in the prior art. For example by adhesively bonding individual heat sink ribs onto a metal block. It is also known, inter alia, to produce such metal bodies by means of a diecasting method, extrusion, forging, pressing or a cutting machining method.

The respective methods are either very time-consuming or complicated in some other respect and therefore correspondingly cost-intensive, or the individual rib bodies and fluid lines may not be of sufficiently narrow form, which results in a small heat exchange surface in terms of surface area.

BRIEF SUMMARY OF THE INVENTION

Proceeding therefrom, it is an object of the present invention to further develop a heat sink of the type mentioned in the introduction and to specify a method and tool, which can be employed or used in particular during the course of the production of such a heat sink, for introducing grooves into a workpiece composed of metal.

This object is achieved by means of a heat sink composed of metal, preferably composed of a solid metal block, in particular composed of aluminium, having a plurality of fluid lines for conducting cooling fluid which are separated from one another by heat sink ribs arranged between them, which are arranged next to one another and which run in a parallel manner, characterized in that the fluid lines are formed by grooves which are milled into the metal; a tool for introducing a plurality of adjacent grooves into a preferably solid workpiece composed of metal, preferably aluminium, in particular during the course of the production of a heat sink composed of metal, having fluid lines for conducting cooling fluid which are formed by the grooves and which are separated by heat sink ribs, wherein the tool has a milling head which is rotatable about an axis of rotation and which has a plurality of milling planes which are arranged next to one another, which each extend in a cross-axial manner and in each of which milling teeth are arranged, wherein the milling teeth of adjacent milling planes are spaced apart from one another in an axial direction at the distance of adjacent grooves to be produced, and wherein the milling teeth are either arranged on milling discs of the milling head which are arranged next to one another in the axial direction, or are part of a milling drum of the milling head; and a method for introducing a plurality of adjacent grooves into an in particular solid workpiece composed of metal, in particular during the course of the production of a heat sink composed of metal, preferably composed of aluminium, having a plurality of fluid lines for conducting cooling fluid which are separated by heat sink ribs, which are arranged next to one another and which run in a parallel manner, wherein a milling head which rotates about an axis of rotation and which has milling teeth in each of a plurality of cross-axial milling planes which are arranged next to one another, the milling teeth of adjacent milling planes being spaced apart from one another in the axial direction at the distance of adjacent grooves to be produced, is used to simultaneously mill a number of grooves, corresponding to the number of milling planes, said grooves in particular forming fluid lines, into the workpiece which is in particular in the form of a solid metal block.

A (solid) heat sink according to the invention, in particular produced from a solid metal block, is accordingly characterized in that the fluid lines thereof are formed by grooves which have been or are milled into the metal of the heat sink.

Surprisingly, it has been shown according to the invention that it is possible to use milling technology to introduce a multiplicity of grooves, which are arranged next to one another, into a (solid) body consisting of metal by process technology in the number and with the dimensions required for the formation of an effective heat sink, with the result that this metal body can then be used as a heat sink in which the grooves form the fluid lines of the heat sink.

In this case, the milling technology used has significant process advantages with respect to the solutions of the prior art mentioned in the introduction.

According to the invention, the grooves are produced by means of a milling head which is rotatable about an axis of rotation and which has a plurality of milling planes which are arranged next to one another, which each extend in a cross-axial manner and in each of which milling teeth are arranged, wherein the milling teeth of adjacent milling planes are spaced apart from one another in an axial direction at the distance of adjacent grooves to be produced, and wherein the milling teeth are either arranged on milling discs which are arranged next to one another in the axial direction, or are part of a milling drum.

According to the invention, during operation, the milling head can then be set in rotation in particular by a drive motor and be led to an in particular solid metal block or metal body from which the heat sink is then intended to be manufactured. The milling head is then used to simultaneously mill a number of grooves, corresponding to the number of milling planes of the milling head, said grooves in particular forming fluid lines, into the metal block.

BRIEF DESCRIPTION OF THE DRAWINGS

Further features of the present invention will emerge from the attached patent claims, from the following description of preferred exemplary embodiments and from the attached drawings.

In the drawings:

FIG. 1b shows a cross section of a subregion of the tool from FIG. 1a;

FIG. 2 shows an oblique view of a cooling device having heat sinks according to the invention; and FIG. 3 shows a cross section of a subregion of one of the heat sinks of the cooling device from FIG. 2, into which heat sink grooves have been introduced by means of the tool of FIG. 1.

DETAILED DESCRIPTION OF PREFERRED EMBODIMENTS

Figure 1A:
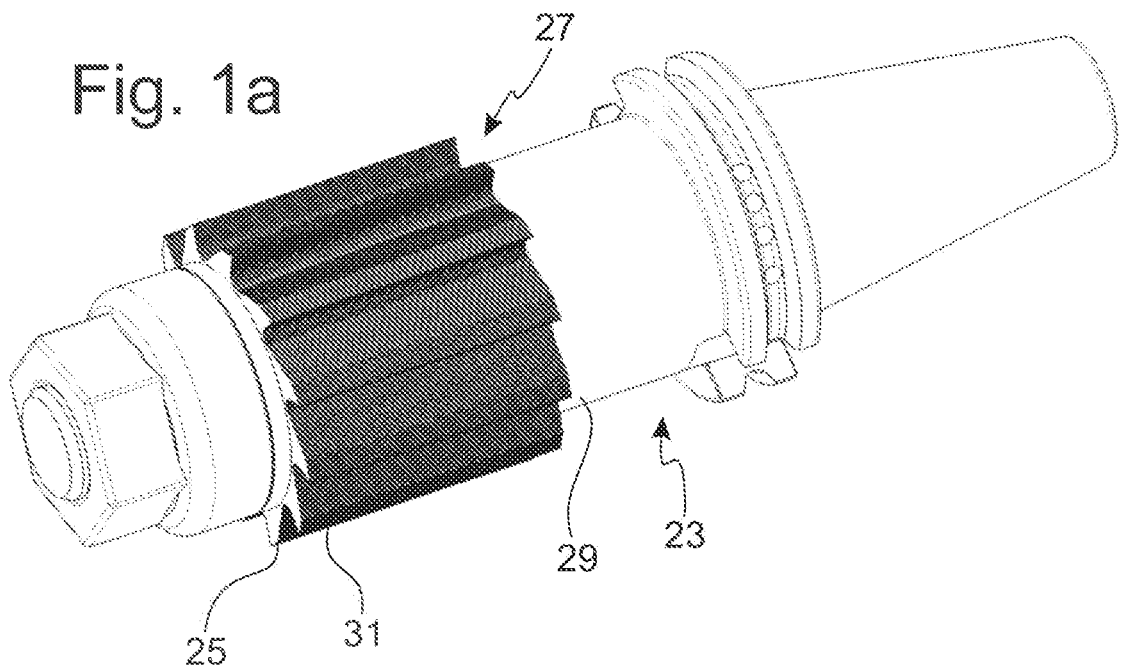
FIG. 1a shows an oblique view of a tool according to the invention for producing a heat sink according to the invention.

The cooling device 10 shown in FIG. 2 is used to dissipate heat from articles 11 to be cooled, in the present case power electronic components (for instance inverter modules) as are used for example in connection with batteries or rechargeable batteries of electric vehicles. However, the type of articles to be cooled is not of importance according to the invention.

The cooling device 10 has a lower heat sink 12 on which the articles 11 to be cooled are arranged or situated and which cools, or absorbs heat from, the undersides of the articles 11 to be cooled, and also has a plurality of, in the present case three, upper heat sinks 20, 21, 22 which each bear against the top sides of the articles 11 to be cooled and cool said articles or absorb heat from the top sides thereof.

In the present case, the lower heat sink 12 and the upper heat sinks 20, 21, 22 are each in the form of solid metal bodies, for example composed of aluminium.

The lower heat sink 12 is part of a lower cooling component 14 which has, in its interior (not shown), a cooling fluid chamber which is delimited towards the outside by the lower heat sink 12 and a base body which is produced for example from plastic, wherein the lower heat sink 12 and the base body assigned thereto are connected to one another (for instance in a materially bonded manner) in a fluid-tight, in the present case liquid-tight, manner. In the figures, for the sake of simplicity, the lower heat sink 12 of the lower cooling component 14 and the base body thereof are not depicted in individually resolved fashion in the drawings, but rather are illustrated as a complete unit or complete block.

The upper heat sinks 20, 21, 22 are part of an upper cooling component 15 which also has, in its interior, a cooling fluid chamber which is delimited towards the outside on the one hand by the upper heat sinks 20, 21, 22 and on the other hand by a base body 19 which is for example also produced from plastic and which is assigned to these upper heat sinks 20, 21, 22. The upper heat sinks 20, 21, 22 and the base body 19, which is collectively assigned thereto, of the upper cooling component 15 are also connected to one another (for instance in a materially bonded manner) in a fluid-tight, in the present case likewise liquid-tight, manner.

One or both cooling fluid chambers may for example consist of or comprise a plurality of fluid lines 32 which are introduced into the respective heat sinks 12 and 20, 21, 22. A detail of a cross section through the heat sink 20 with the fluid lines 32 is shown in FIG. 3 by way of example.

In the present case, the lower cooling component 14 and the upper cooling component 15, more precisely the cooling fluid chambers of same, are connected to one another in a fluid-conducting manner by way of laterally arranged connecting lines 16 which run in particular perpendicularly with respect thereto.

The cooling device 10 furthermore has a medium inlet 17 and a medium outlet 18.

As a result, it is correspondingly possible for cooling fluid, which during operation of the cooling device 10 can dissipate the (waste) heat that the heat sinks 12 and 20, 21, 22 absorb from the articles 11 to be cooled, to be supplied via the medium inlet 17 initially to the lower cooling component 14 and subsequently also to the upper cooling component 15.

As a rule, the cooling fluid will be a cooling liquid. However, it goes without saying that it is also within the scope of the invention to use a gaseous medium as cooling fluid. The corresponding fluid-tight connections between the respective base body and the lower and, respectively, upper heat sinks 12 and, respectively, 20, 21, 22 etc. would then correspondingly have to be of gas-tight form.

Furthermore, it goes without saying that the above-described exact configuration of the heat sinks 12, 20, 21, 22, and in particular also of the entire cooling device 10, is not of importance according to the invention, and should be understood as merely exemplary.

According to the invention, the fluid lines 32 which are introduced into the heat sinks 12, 20, 21, 22 are grooves 24 which are arranged next to one another and which have been milled into the heat sinks 12, 20, 21, 22, or into a corresponding metal block or metal body from which said heat sinks are produced, so as to form heat sink ribs 26 which are arranged between said grooves.

This is effected for example by means of a (milling) tool in the form of a milling head 23 which is shown in FIG. 3 and which will be described in more detail below, said tool correspondingly being led in a milling process to the for example cuboid metal block for the purpose of milling the grooves 24 therein.

The grooves 24 preferably run parallel to one another. In each case two directly adjacent grooves 24 are separated from one another by a respective heat sink rib 26 which is arranged between them and the surfaces of which form the heat exchange surfaces of the respective heat sink 12, 20, 21, 22, the cooling fluid flowing through the grooves 24 absorbing and dissipating the heat absorbed by the heat sinks 12, 20, 21, 22 via said surfaces.

The heat sink ribs 26 are formed by those material regions of the respective metal block, from which the heat sinks 12, 20, 21, 22 are produced, which have not been machined by the milling discs 25 of the milling head 23 and which correspondingly remain standing.

In the present case, all the grooves 24 and all the heat sink ribs 26 have an identical width. However, this does not necessarily have to be the case.

Figure 1B:
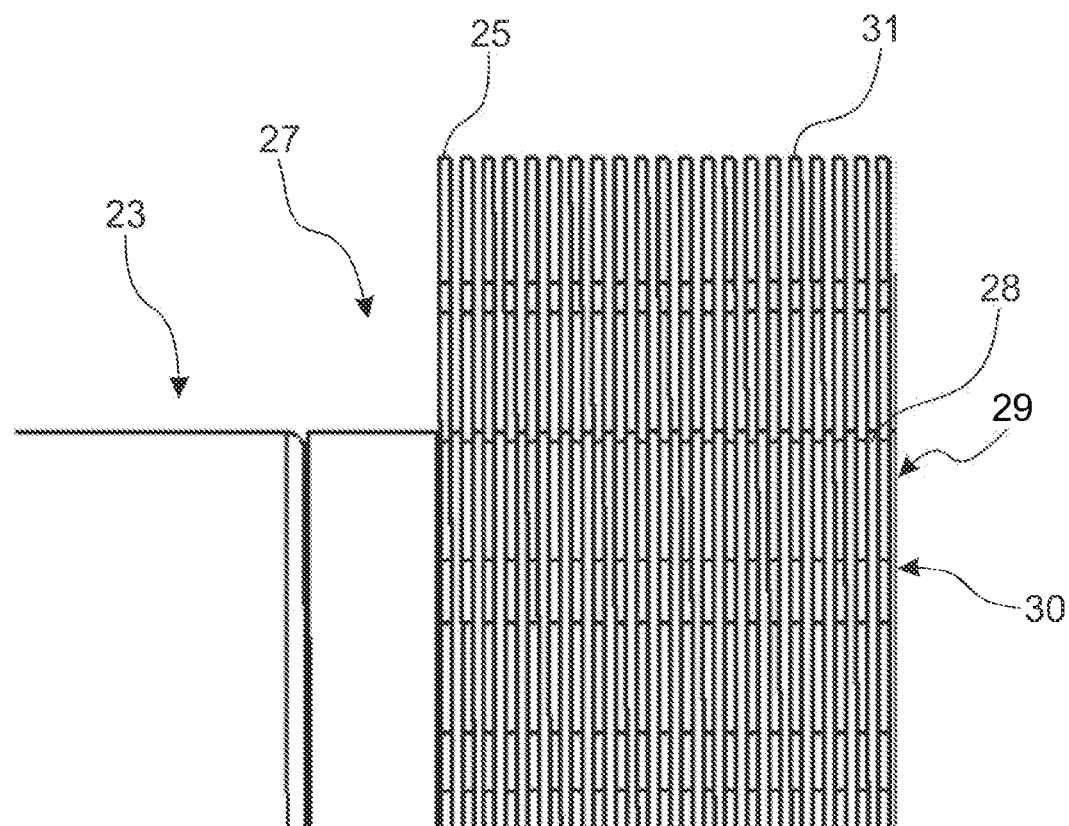

With regard to the (milling) tool shown in FIG. 1 or the milling head 23 shown in said figure, the latter is fastened, during operation, to a receptacle of a milling machine (otherwise not shown) which transmits rotational movements of a motor to the milling head 23 and correspondingly sets said milling head in rotation about the axis of rotation thereof.

The milling head 23 has a shaft 27 which has an in the present case cylindrical portion 29 and which, during operation of the tool 23, is clamped into the tool receptacle of the milling machine and is set in rotation about the longitudinal centre axis thereof.

A multiplicity of in the present case ring-like milling discs 25 which are arranged next to one another are arranged on the shaft 27 or on the cylindrical portion 29 thereof in a rotationally fixed manner, wherein each milling disc 25 has a respective central, in the present case circular milling disc passage opening or milling disc bore 30 into which the shaft 27 is inserted in each case or through which the shaft 27 is guided in each case.

The individual, in the present case planar or flat milling discs 25, in particular in each case directly adjacent milling discs 25, are each spaced apart from one another in the axial direction, preferably in the region of their milling teeth 31 which are arranged distributed around the respective circumference of the milling discs 25.

Generally speaking, the milling teeth 31 of the milling head 23 are arranged in individual milling planes which are arranged next to one another, which are spaced apart from one another in the axial direction (defined in the present case by the milling discs 25) and which each extend in a cross-axial manner, wherein the respective axial distance between milling teeth 31 which are arranged in adjacent milling planes corresponds in each case to the distance between the grooves 24 or fluid lines 32 which are introduced into the respective heat sink 12, 20, 21, 22.

With regard to the individual milling discs 25 of the milling head 23, these are preferably connected to the shaft 27, or arranged/fastened on the shaft 27, in a rotationally fixed manner under an axial preload, in particular under a preload of at least 150 kN.

The respective axial distance between the milling teeth 31 of adjacent milling planes may for example be brought about in each case by a spacer 28.

In the present case, the spacer 28 provided is in each case a separate, ring-shaped spacer disc which sits in each case on the shaft 27 and specifically in each case between two adjacent milling discs 25.

However, other solutions for producing the axial distances between the milling teeth 31 of adjacent milling planes (said axial distances corresponding in the present case to the axial distances between adjacent milling discs 25 because the milling discs 25 are of planar form) are also conceivable.

It would for example also be possible for the spacers 28 to in each case be integrally connected to one of the two milling discs 25 between which it is arranged.

Moreover, in an alternative to the milling head 23 shown in FIG. 1, it would also be possible for all the milling discs 25 to be mutually integrally connected to one another by way of spacers 28, such that a kind of milling drum would be produced.

In another refinement of this concept, such a milling drum or another form of milling drum could also have a cylindrical core with central (longitudinal) bore, said core being pushed onto the shaft 27 and being integrally connected to milling teeth 31 which are correspondingly arranged at (axial) distances in the cross-axial milling planes.

Moreover, with regard to the arrangement of the milling teeth 31, provision could also be made—by contrast to what is shown in FIG. 1—for milling teeth 31 which are arranged in a first group of milling planes and milling teeth 31 which are arranged in a second group of milling planes to be arranged offset in a circumferential direction with respect to one another, in particular in such a way that simultaneous engagement of the milling teeth 31 of the one and the other group into the workpiece to be machined or the corresponding metal block/metal body is avoidable or avoided.

It has been shown that certain parameters of the grooves 24 or of the heat sink ribs 26 are (although not necessary) particularly favourable for the heat transfer of the heat sink 12, 20, 21, 22:

The grooves 24 should preferably each have a depth of between 1 mm and 20 mm, particularly preferably of between 4 mm and 15 mm.

In this case, the penetration depth of the milling teeth 31 of the milling head 23 can correspondingly satisfy the same values.

Further preferably, the grooves 24 should have a width of between 0.1 mm and 2 mm, particularly preferably of between 0.2 mm and 0.8 mm.

The width of the milling teeth 31 of the milling head 23 and/or the width of the milling discs 25, which determines the width of the grooves 24, may then correspondingly in each case likewise have a value of between 0.1 mm and 2 mm, particularly preferably of between 0.2 mm and 0.8 mm.

The heat sink ribs 26 arranged between the grooves 24 should preferably each have a width of between 0.1 mm and 2 mm, particularly preferably of between 0.2 mm and 0.8 mm.

The corresponding axial distances between the milling teeth 31 and/or milling discs 25 which are arranged in adjacent milling planes, said axial distances determining the axial distances between adjacent producible grooves 24 or the width of the heat sink ribs 26, may then in each case likewise have a value of between 0.1 mm and 2 mm, particularly preferably of between 0.2 mm and 0.8 mm.

The width of all the milled grooves 24 should preferably be identical.

Correspondingly, the width of the milling teeth 31 of all the milling planes may likewise be identical.

The width of the grooves 24 should preferably correspond to the width of the heat sink ribs 26 arranged between them.

Correspondingly, the width of the milling teeth 31 and the width of the axial distances between the milling teeth 31 and/or milling discs 25 which are arranged in adjacent milling planes may then likewise be identical.

With regard to the number of grooves 24 milled into the heat sink 12, 20, 21, 22, said number should be between 5 and 150, particularly preferably between 10 and 100.

The same may then apply to the milling head 23, which has between 5 and 150, particularly preferably between 10 and 100, milling planes which are arranged next to one another, which are in particular defined by the milling discs 25 or the milling teeth 31 of the milling discs 25 and in which the milling teeth 31 are in each case arranged.

The number of heat sink ribs 26 arranged next to one another per cm of heat sink width should preferably be between 2.5 and 50, particularly preferably between 6.25 and 25.

Moreover, it holds true (see above) for all of the grooves 24 of the heat sink 12, 20, 21, 22 which are arranged next to one another that in each case two adjacent grooves 24 should be separated by a heat sink rib 26 which is arranged between them.

LIST OF REFERENCE DESIGNATIONS

10 Cooling device
11 Article to be cooled
12 Lower heat sink
14 Lower cooling component
15 Upper cooling component
16 Connecting line
17 Medium inlet
18 Medium outlet
19 Base body of upper cooling component
20 Upper heat sink
21 Upper heat sink 22 Upper heat sink
23 Milling head
24 Grooves
25 Milling discs
26 Heat sink ribs
27 Shaft
28 Spacer
29 Cylindrical portion
30 Milling disc bore
31 Milling teeth
32 Fluid lines

What is claimed is:

1. A method for introducing a plurality of adjacent grooves (24) into a workpiece composed of metal during the course of the production of a heat sink composed of metal, the heat sink having a plurality of fluid lines (32) for conducting cooling fluid which are separated by heat sink ribs (26), which are arranged next to one another and which run in a parallel manner, comprising milling the workpiece with a milling head (23) to simultaneously mill a number of grooves (24) into the workpiece to form the fluid lines (32),
wherein the milling head (23) rotates about an axis of rotation,
wherein the milling head (23) has milling teeth (31) in each of a plurality of cross-axial milling planes which are arranged next to one another,
wherein the grooves (24) are spaced apart from each other a predetermined distance,
wherein the milling teeth (31) of adjacent milling planes are spaced apart from one another in an axial direction at the predetermined distance between adjacent grooves (24),
wherein the grooves (24) are milled to have a depth of between 1 mm and 20 mm and a width of between 0.1 mm and 2 mm,
wherein, for all of the grooves (24) of the heat sink which are arranged next to one another, in each case two adjacent grooves (24) are separated by a heat sink rib (26) which is arranged between them, and
wherein the heat sink ribs (26) arranged between the grooves (24) each have a width of between 0.2 mm and 0.8 mm.

2. The method according to claim 1, wherein the milling head (23) has between 5 and 150 of the milling planes arranged next to one another and wherein the milling planes comprise milling teeth (31), wherein the milling teeth (31) are either arranged on milling discs (25) of the milling head (23) which are arranged next to one another in the axial direction, or are part of a milling drum of the milling head (23).

3. The method according to claim 2, further comprising arranging the milling discs next to one another on a shaft (27) of the milling head (23) in a rotationally fixed manner, the milling head (23) being rotatable or rotated about a longitudinal centre axis of said shaft during operation.

4. The method according to claim 3, wherein the milling discs which are adjacently arranged on the shaft (27) are spaced apart from one another in the axial direction by a spacer (28) which is arranged between them.

5. The method according to claim 4, wherein the spacer (28) is a separate spacer ring which sits on the shaft (27).

6. The method according to claim 5, wherein the spacer is integrally connected to one or both of the adjacent milling discs.

7. The method according to claim 3, further comprising fastening the individual milling discs to the shaft (27) under an axial preload.

8. The method according to claim 7, wherein the individual milling discs are fastened to the shaft (27) under an axial preload of at least 150 kN.

9. The method according to claim 2, wherein the milling teeth (31) have a width and/or the milling discs have a width of between 0.1 mm and 2 mm, which width determines the width of the grooves (24).

10. The method according to claim 2, further comprising arranging the milling teeth (31) and/or milling discs in adjacent milling planes that are separated by an axial distance that determines the axial distances between adjacent producible grooves (24), wherein the axial distance between the milling teeth (31) and/or milling discs is between 0.2 mm and 0.8 mm.

11. The method according to claim 2, further comprising arranging a first portion of the milling teeth (31) in a first group of milling planes and arranging a second group of the milling teeth (31) in a second group of milling planes, the milling teeth (31) of the first group of milling planes being arranged offset in a circumferential direction with respect to the milling teeth (31) of the second group of milling planes.

12. The method according to claim 2, wherein the milling head (23) has between 10 and 100 milling planes which are arranged next to one another and in which milling teeth (31) are arranged.

13. The method according to claim 2, wherein the milling planes are defined by the milling discs or the milling teeth (31) of the milling discs.

14. The method according to claim 1, wherein the width of all the milled grooves (24) is identical.

15. The method according to claim 14, wherein the width of the grooves (24) corresponds to the width of the heat sink ribs (26) arranged between them.

16. The method according to claim 1, wherein the grooves (24) are milled to have a depth of between 4 mm and 15 mm.

17. The method according to claim 1, wherein the grooves (24) are milled to have a width of between 0.2 mm and 0.8 mm.

18. The method according to claim 1, wherein the number of grooves (24) milled into the heat sink is between 5 and 150.

19. The method according to claim 1, wherein the number of grooves (24) milled into the heat sink is between 10 and 100.

20. The method according to claim 1, wherein the number of heat sink ribs (26) arranged next to one another per cm of heat sink width is between 2.5 and 50.

21. The method according to claim 1, wherein the number of heat sink ribs (26) arranged next to one another per cm of heat sink width is between 6.25 and 25.

22. A method for introducing a plurality of adjacent grooves (24) into a workpiece composed of metal during the course of the production of a heat sink composed of metal, the heat sink having a plurality of fluid lines (32) for conducting cooling fluid which are separated by heat sink ribs (26), which are arranged next to one another and which run in a parallel manner, comprising milling the workpiece with a milling head (23) to simultaneously mill a number of grooves (24) into the workpiece to form the fluid lines (32),
wherein the milling head (23) rotates about an axis of rotation,
wherein the milling head (23) has milling teeth (31) in each of a plurality of cross-axial milling planes which are arranged next to one another,
wherein the grooves (24) are spaced apart from each other a predetermined distance, wherein the milling teeth (31) of adjacent milling planes are spaced apart from one another in an axial direction at the predetermined distance between adjacent grooves (24), wherein the grooves (24) are milled to have a depth of between 1 mm and 20 mm and a width of between 0.1 mm and 2 mm, whereby the heat sink ribs (26) arranged between the grooves (24) each have a width of between 0.1 mm and 2 mm, wherein, for all of the grooves (24) of the heat sink which are arranged next to one another, in each case two adjacent grooves (24) are separated by a heat sink rib (26) which is arranged between them, and wherein the number of heat sink ribs (26) arranged next to one another per cm of heat sink width is between 6.25 and 25.

\* \* \* \* \*